United States Patent [19]

Ashida

[11] 4,451,782
[45] May 29, 1984

[54] SPECTRUM ANALYZER

[75] Inventor: Hitoshi Ashida, Higashimatsuyama, Japan

[73] Assignee: Takeda Riken Kogyo Kabushiki Kaisha, Tokyo, Japan

[21] Appl. No.: 309,090

[22] Filed: Oct. 6, 1981

[30] Foreign Application Priority Data

Oct. 8, 1980 [JP] Japan ................. 55-141035

[51] Int. Cl.³ ........................... G01R 23/16
[52] U.S. Cl. .............. 324/77 C; 324/77 H; 324/83 A; 324/83 R
[58] Field of Search .......... 324/77 R, 77 A, 77 B, 324/77 C, 77 CS, 77 D, 77 E, 77 F, 77 G, 77 H, 79 R, 83 R, 83 FE, 83 Q, 85

[56] References Cited

U.S. PATENT DOCUMENTS 3,986,113 10/1976 Vifian ........................... 324/85
4,325,023 4/1982 Zirwick ..................... 324/77 B Primary Examiner—Michael J. Tokar
Assistant Examiner—B. J. Kelley
Attorney, Agent, or Firm—Staas & Halsey

[57] ABSTRACT

In a spectrum analyzer, an intermediate-frequency oscillator and the outputs from a sweep oscillator are frequency mixed to obtain a measuring signal, which is provided to a device under test. The intermediate-frequency signal and the output from the intermediate-frequency oscillator are supplied to a phase detector to detect a phase difference between them. A signal representing the detected phase difference and the output from a detector are selectively applied by a switch to a display.

22 Claims, 14 Drawing Figures

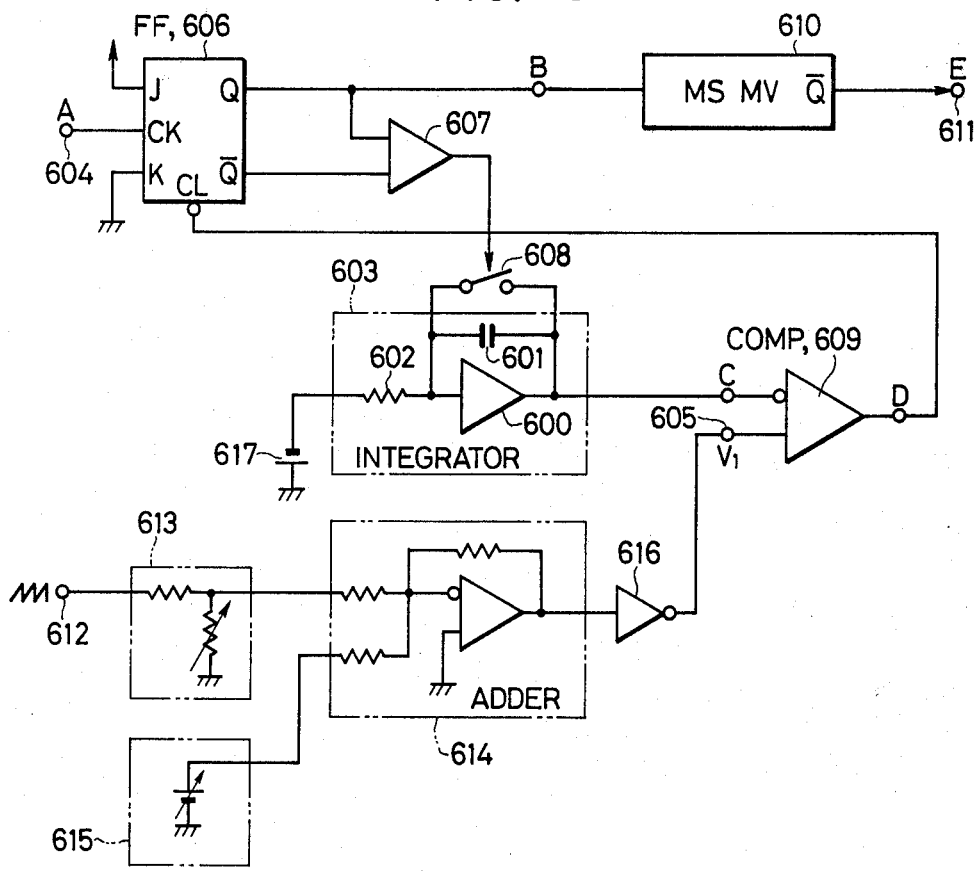
FIG. 6
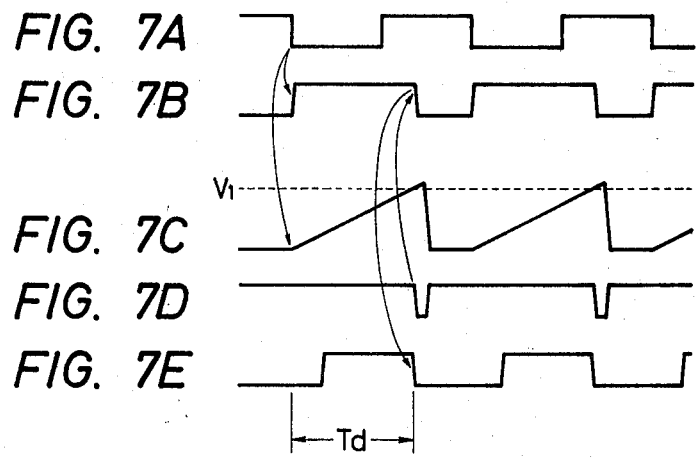
FIG. 7A
FIG. 7B
FIG. 7C
FIG. 7D
FIG. 7E

SPECTRUM ANALYZER

BACKGROUND OF THE INVENTION

The present invention relates to a spectrum analyzer designed to display the frequency component of an input signal, and more particularly to a spectrum analyzer which is capable of measuring the phase characteristic of a device under test as well.

Heretofore, there has been known, as a spectrum analyzer, measuring equipment for analyzing the frequency component of a signal from each of various signal sources, for example, an output signal from an amplifier, filter, oscillator or the like, and the level at each frequency. For measuring the phase-frequency characteristic or amplitude-frequency characteristic of the amplifier, filter, oscillator or the like, use has been made of a network analyzer by which signals of various frequencies are applied to the device under test to measure a phase difference between its input and output. The network analyzer calls for a signal generator capable of varying the signals for the device under test over a very wide frequency range, and hence it is very expensive.

For a frequency analysis and measurement of a phase-frequency characteristic, the prior art requires the use of both the spectrum analyzer and the network analyzer, and the preparation of both of them is appreciably expensive.

SUMMARY OF THE INVENTION

It is therefore an object of the present invention to provide a spectrum analyzer which is also equipped with the function of the network analyzer for measuring the phase-frequency characteristic of a device under test, but which is relatively inexpensive.

Another object of the present invention is to provide a spectrum analyzer which is capable of expanding the amount of phase rotation in a device under test for accurate measurement.

Another object of the present invention is to provide a spectrum analyzer which is capable of compressing the amount of phase rotation in a device under test to allow ease in observing its display.

Yet another object of the present invention is to provide a spectrum analyzer which is provided with a relatively simple circuit capable of compensating for phase rotation in other circuit elements than a device under test, such as a lead connected thereto and so forth.

According to the present invention, an input signal from a signal input terminal and a frequency swept signal from a sweep oscillator are frequency mixed by a frequency mixer into an intermediate-frequency signal. The intermediate-frequency signal is further frequency converted as required and then detected by a detector. The detected output and a frequency sweep signal for the sweep control oscillator are supplied to a display to display thereon the amplitude-frequency characteristic of the input signal. Further, an intermediate-frequency oscillator is provided which oscillates at the same frequency as the frequency of an intermediate-frequency signal between the output side of the frequency mixer and the input side of the detector. A signal of a frequency corresponding to the oscillation output from the intermediate-frequency oscillator and the frequency swept signal from the sweep oscillator are frequency mixed into a measuring signal. The measuring signal is provided to a measuring signal terminal, from which it is applied to the device under test. The output signal from the intermediate-frequency oscillator and the aforesaid any one of the intermediate-frequency signals are phase compared by a phase comparator or phase detector. The compared output and the output from the phase detector are selectively fed by a switch to the display. Accordingly, by applying the measuring signal from the measuring signal terminal to the input side of the device under test, applying its output signal to the signal input terminal and applying the output from the phase comparator to the display, the frequency of the measuring signal varies with the frequency of the frequency swept signal and the phase-frequency characteristic of the device under test is displayed on the display.

In the case where the amount of phase rotation in the device under test is small, the phase difference between the two signals applied to the phase comparator is expanded by a phase expander utilizing frequency multiplying means, by which the accuracy of the measurement of the phase-frequency characteristic can be increased. Conversely, in the case where the amount of phase rotation is too large, the phase difference between the both signals applied to the phase comparator is compressed by a phase compressor utilizing frequency dividing means, by which the phase difference can be made easy to observe on the display surface of the display. Further, a phase compensator for compensating for phase rotation occurring in other circuit elements than the device under test, such as a connection lead and the like, can be inserted in one of two input sides of the phase comparator. In the case where the phase rotation, occurring in other circuit elements than the device under test, varies with frequency, the amount of phase compensation by the phase compensator is controlled by the frequency sweep control signal for the sweep oscillator, thereby performing an accurate phase compensation regardless of the frequency of the measuring signal. In the phase comparator, the input signal is frequency divided by a frequency divider down to 1/N, the frequency-divided signal is applied to a phase shifter, its amount of phase shift is controlled by the frequency sweep control signal and the phase-shifted output is frequency multiplied by a frequency multiplier M times, whereby the amount of shift can be controlled over a wide range.

BRIEF DESCRIPTION OF THE DRAWINGS

FIG. 6 is a connection diagram showing a specific example of a variable phase shifter for use in the present invention;

FIGS. 7A through 7E, show a series of timing charts explanatory of the operation of the variable phase shifter depicted in FIG. 6;

DETAILED DESCRIPTION OF THE PREFERRED EMBODIMENTS

Figure 1:
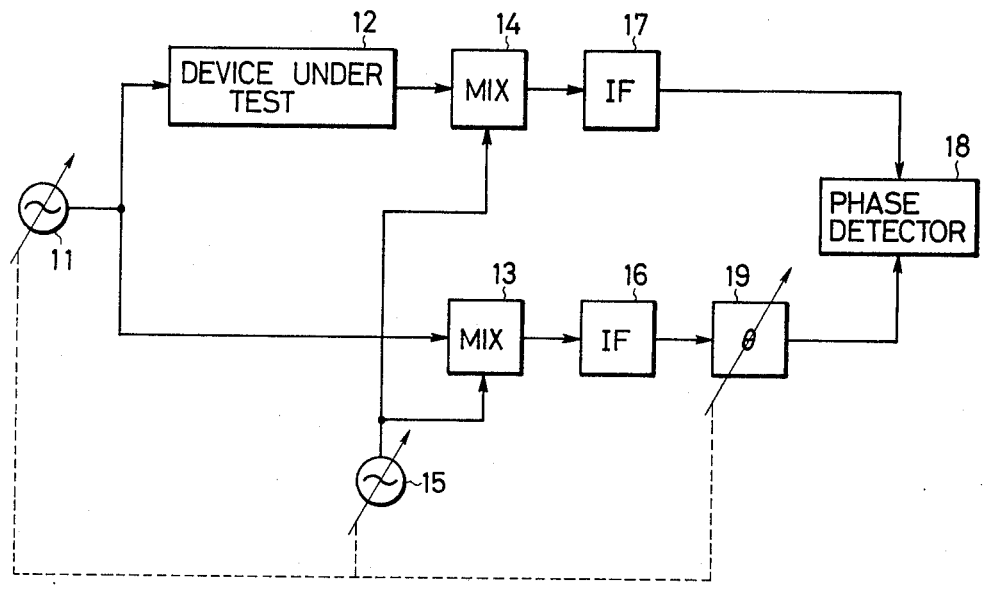
FIG. 1 is a block diagram showing a conventional network analyzer.

To facilitate a better understanding of the present invention, a description will be given, with reference to FIG. 1, of a phase-frequency characteristic obtained with a prior art network analyzer. The network analyzer shown in FIG. 1 is set forth in U.S. Pat. No. 3,986,113 issued on Oct. 12, 1976. The output from a frequency sweep oscillator 11 is supplied to a device under test 12, such as an amplifier, filter or the like and, at the same time, it is provided directly to a frequency converter 13. The output from the device under test 12 is applied to a frequency converter 14. The frequency converters 13 and 14 are each supplied with the output from a local oscillator 15 the frequency of which is swept in synchronism with the frequency sweep oscillator 11. Intermediate-frequency signals of the same frequency, which are obtained from the frequency converters 13 and 14, are amplified by intermediate-frequency amplifiers 16 and 17, respectively. The phase of the output from the intermediate-frequency amplifier 17 is detected by a phase comparator 18 relative to the output from the intermediate-frequency amplifier 16. In this case, in order to detect the phase-frequency characteristic only of the device under test 12, it is necessary to compensate for a phase variation which is caused for instance in the path from the oscillator 11 to the frequency converter 13 relative to a reference signal. To this end, the output from the intermediate-frequency amplifier 16 is applied via a phase compensator 19 to the phase comparator 18 to control the amount of a phase shift of the phase compensator 19 by the swept signal of the frequency sweep oscillator 11. Such a network analyzer as described above cells for the two frequency sweep oscillators 11 and 15 and requires appreciably wide ranges of their frequency sweep, and hence it is expensive.

Figure 2:
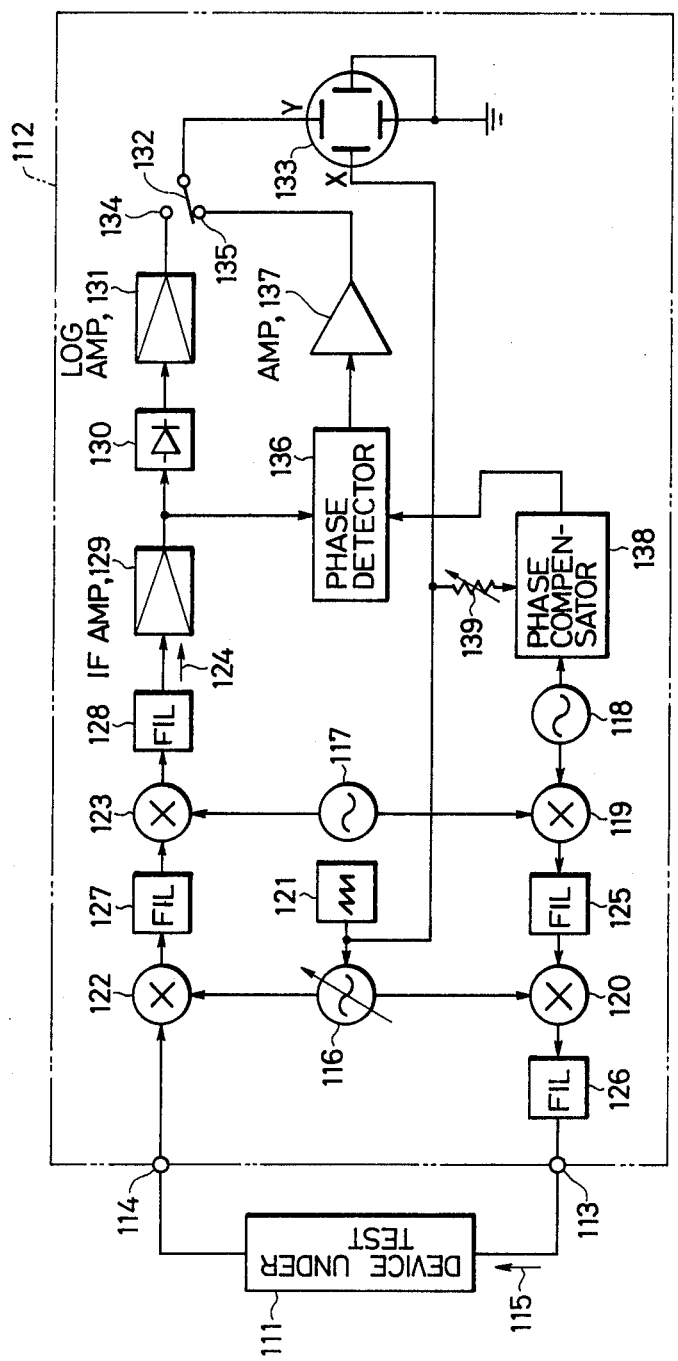
FIG. 2 is a block diagram illustrating an embodiment of the spectrum analyzer of the present invention.

FIG. 2 illustrates an embodiment of the present invention. A spectrum analyzer of the present invention, indicated generally by 112, is provided with a signal input terminal 114 and, in the case of analyzing the frequency of an input signal, the output side of a device under test 111 which is a signal source is connected to the signal input terminal 114. An input signal from the input terminal 114 is supplied to a frequency mixer 122, wherein it is mixed with a frequency swept signal from a sweep oscillator 116. From the output of the frequency mixer 122 a first intermediate-frequency signal is taken out by a filter 127. This first intermediate-frequency signal has for example a frequency $f_l - f_x = f_i$ which is the difference between the frequency $f_x$ of the input signal and the frequency $f_l$ of the frequency sweep signal. The frequency $f_i$ of the first intermediate-frequency signal is not always lower than the input signal frequency $f_x$ but may sometimes be selected higher than the latter so as to separate an image frequency caused by the frequency mixing. Further, a first intermediate-frequency signal of a sum frequency $f_x + f_l$ may be derived from the filter 127 in some cases.

The frequency mixer 122 and the filter 127 constitute a frequency converter. The input signal, frequency-converted by this frequency converter, is frequency mixed by a frequency mixer 123 with a local signal from a local oscillator 117 and a signal of a frequency corresponding to the difference between the frequencies of both signals is taken out by a filter 128. A second intermediate-frequency signal thus obtained from the filter 128 is amplified by an intermediate-frequency amplifier 129 and the amplified output therefrom is detected by a detector 130. The detected output is amplified by a logarithmic amplifier 131 and provided via a fixed contact 134 of a switch 132 to a Y-axis deflection input terminal of a CRT display 133.

A control signal, such as a sawtooth wave signal, is applied from a frequency control signal generator 121 to the sweep oscillator 116 to sweep its oscillation frequency. The control signal from the frequency control signal generator 121 is also applied to an X-axis deflection input terminal of the CRT display 133. Accordingly, a bright spot is produced on the display surface of the CRT display 133 at a position corresponding to the input signal frequency and level on the abscissa and the ordinate of the display surface, respectively. The above-said construction is identical with that of the conventional spectrum analyzer. As is the case with the prior art, the frequency conversion in the intermediate-frequency signal system from the frequency mixer 122 to the detector 130 need not always be limited to one stage as employed in this example but may also be performed by a plurality of stages and, further, the output from the filter 127 may also be directly amplified and fed to the detector 130. In other respects, various arrangements can be adopted as in the case of the conventional spectrum analyzer.

According to the present invention, the spectrum analyzer 112 is provided with a measuring signal terminal 113, to which is applied a signal for frequency characteristic measurement use which is produced in the spectrum analyzer 112. To perform this, an intermediate-frequency oscillator 118 is provided which oscillates at a frequency equal to that of the second intermediate-frequency signal that is derived from the filter 128. The oscillation output from the intermediate-frequency oscillator 118 is frequency mixed by a frequency mixer 119 with the local signal from the local oscillator 117. From the output of the frequency mixer 119 is derived by a filter 125 a signal of the same frequency as the frequency $f_i$ of the first intermediate-frequency signal. The output from the filter 125 is applied to a frequency mixer 120, wherein it is frequency mixed with the frequency swept signal $f_l$ from the sweep oscillator 116. The frequency-mixed output is provided to a filter 126, wherein a component of a difference frequency $f_l - f_i$ is selected, and the output from the filter 126 is supplied as the measuring signal to the measuring signal terminal 113. Accordingly, the frequency of the measuring signal varies in synchronism with the frequency sweep of the oscillation frequency of the sweep oscillator 116.

In the case of measuring the phase-frequency characteristic of the device under test 111, such as an amplifier, filter, transmission line or the like, a measuring signal 115 from the measuring signal terminal 113 is applied to the input side of the device under test 111 and the output signal from its output side is fed to the input terminal 114. The second intermediate-frequency signal 124 available at this time is supplied to one input of a phase detector 136. The output from the intermediate-frequency oscillator 118 is provided as a reference signal to the other input side of the phase detector 136, if necessary via a phase compensator 138. The output from the phase detector 136 is amplified by an amplifier 137 and applied via a fixed contact 135 of the switch 132 to the Y-axis deflection terminal of the CRT display 133.

The measuring signal from the terminal 113, when passing through the device under test 111, is subjected to phase rotation. This phase rotation appears in the second intermediate-frequency signal and the amount of phase rotation in the device under test 111 is detected by the phase detector 136. Since the frequency of the measuring signal 115 is being swept, the phase-frequency characteristic of the device under test 111 is displayed on the CRT display 133.

In the case where the phase rotation between the input terminal of the device under test 111 and the reference signal input terminal of the phase detector 136 differs from the phase rotation between the output terminal of the device under test 111 and the other input terminal of the phase detector 136 for the signal to be phase detected, the reference signal is phase compensated by the phase compensator 138 as in the case of FIG. 1. The difference in phase rotation generally increases as the frequency rises. Accordingly, by applying the control signal via a variable resistor 139 from the frequency control signal generator 121 to the phase compensator 138 while holding the input and output terminals of the device under test 111 or the terminals 113 and 114 in a shorted state, the variable resistor 139 may be adjusted so that the phase-frequency characteristic becomes flat on the display surface of the CRT display 133, whereby the phase compensation corresponding to the frequency of the measuring signal from the terminal 113 is automatically achieved.

Figure 3:
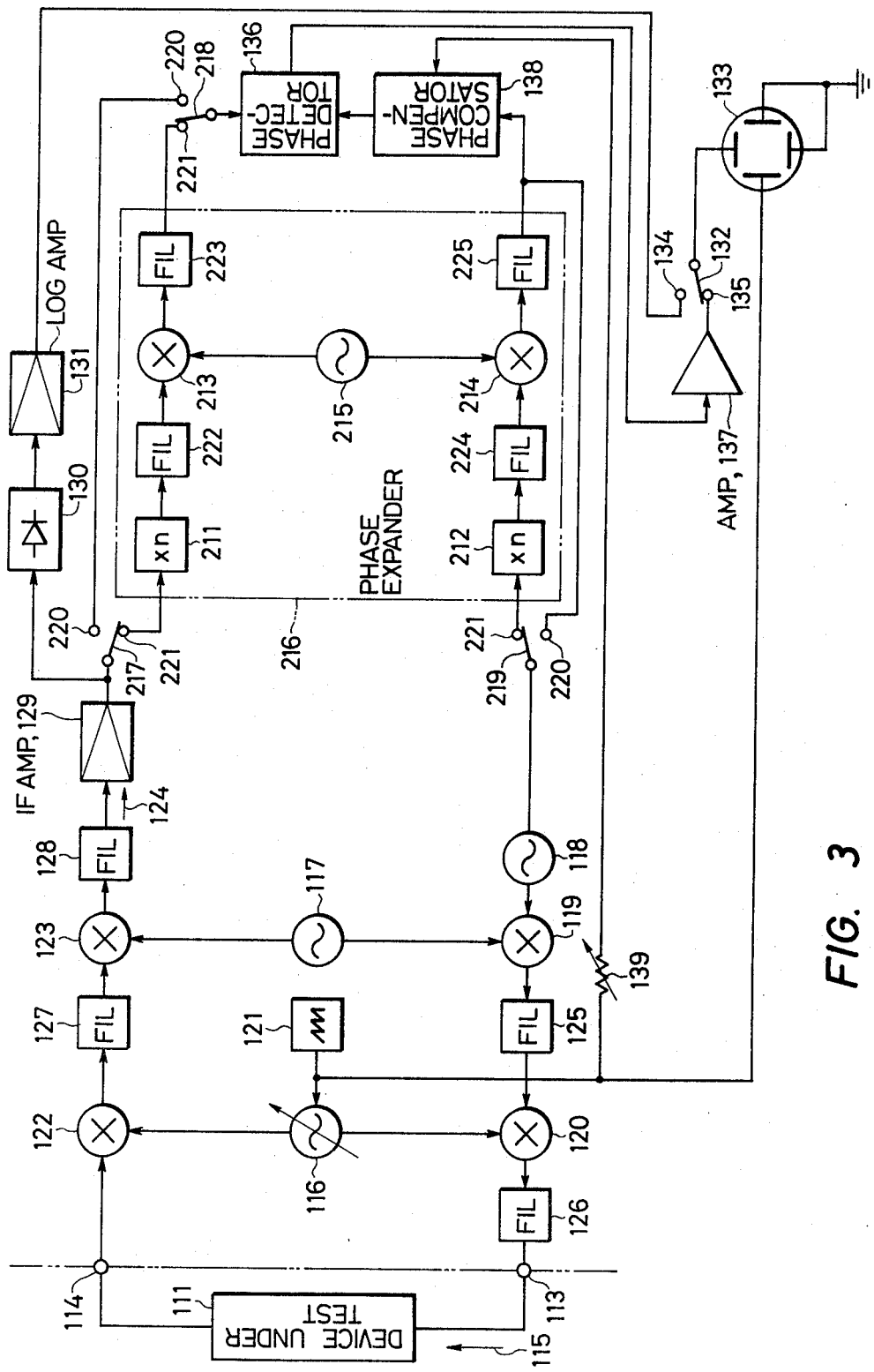
FIG. 3 is a block diagram illustrating another embodiment of the spectrum analyzer of the present invention which is provided with a phase expander.

With such an arrangement, the phase characteristic can be measured by the spectrum analyzer 112. By the way, in the case where the amount of phase rotation in the device under test 111 is small over the entire range of the sweep frequency, a deviation from the reference signal phase cannot be displayed with high accuracy. By increasing the gain of the amplifier 137, the amount of phase rotation can be displayed with high resolution to some extent. With increased gain of the amplifier 137, however, the SN ratio becomes degraded, and consequently there is a limit to the enhancement of resolution. A very small amount of phase rotation can be measured with high accuracy by expanding it with a phase expander including a frequency multiplying means and phase comparing it with the reference signal using a phase comparator. FIG. 3 illustrates an example of using the phase expander. In FIG. 3, the parts corresponding to those in FIG. 2 are identified by the same reference numerals and no detailed description will be repeated in connection with them. This example employs a multiplier 211 for multiplying the frequency of the second intermediate-frequency signal 124 n times (n being a positive integer), a multiplier 212 for multiplying the frequency of the oscillation output signal of the intermediate-frequency oscillator 118 n times, frequency mixers 213 and 214 for returning the multiplied signals to the original intermediate-frequency signals and a second local oscillator 215. The n multipliers 211 and 212, the frequency mixers 213 and 214 and the second local oscillator 215 constitute a phase expander 216. Switches 217, 218 and 219 are provided for selecting the phase expander 216; namely, the phase difference is expanded or not depending on whether the switches are connected to contacts 220 or 221.

When multiplying the intermediate-frequency signal 124 n times by the n multiplier 211, the phase difference between the multiplied signal and the output signal resulting from an n-fold multiplication of the reference signal from the intermediate-frequency oscillator 118 n times by the multiplier 212 becomes equal to n times the phase difference between the intermediate-frequency signal 124 and the reference signal. Also the output from the phase detector 136, when applied to the phase expander 216, is expanded n times as large as the output obtained when it is not applied to the phase expander 216. In this way, resolution can be raised by a factor of n.

In FIG. 3, filters 222 and 224 are provided for deriving n-multiplied signals from the outputs of the n multipliers 211 and 212, respectively, and filters 223 and 225 are provided for deriving from the outputs of the frequency mixers 213 and 214 components of difference frequencies between the n-multiplied frequencies and the oscillation frequency of the second local oscillator 215, respectively.

Figure 4:
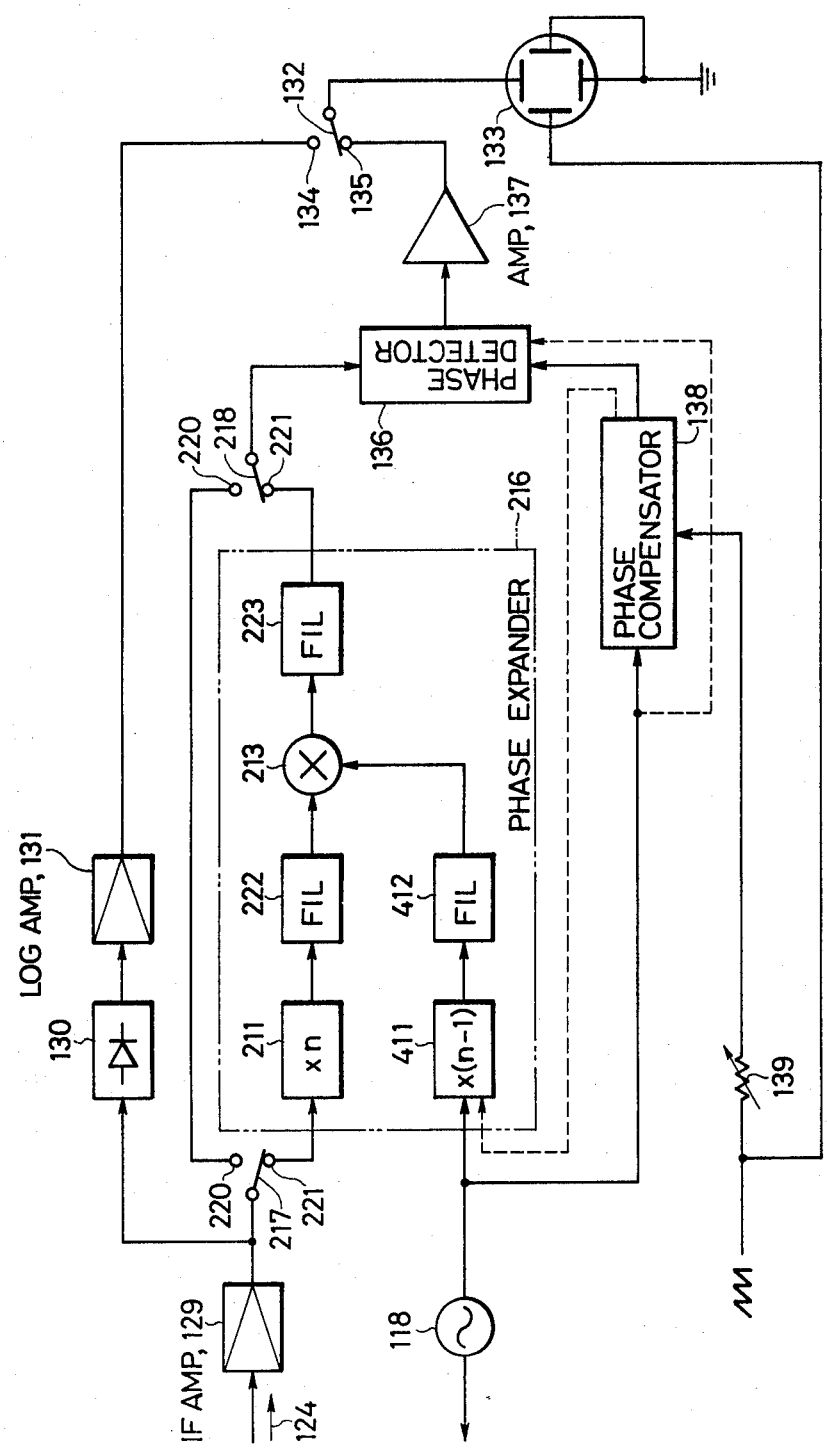
FIG. 4 is a block diagram showing a modified form of a phase expander 216 for use in the present invention.

FIG. 4 illustrates another embodiment of the present invention, in which the phase expander 216 is constituted without using the second local oscillator 215 utilized in FIG. 3. The second local oscillator 215 is replaced with an (n−1) multiplier 411, by which the frequency of the oscillation output from the intermediate-frequency oscillator 118 is multiplied (n−1) times. The multiplied frequency is taken out by a filter 412 and a signal of the multiplied frequency is applied therefrom to the frequency mixer 213, from which is taken out by the filter 223 a signal of the difference frequency between the n-multiplied signal and the (n−10)-multiplied signal. Accordingly, the filter 223 derives at its output a signal of the same frequency as the intermediate-frequency signal 124, that is, a signal of the same frequency as the oscillation frequency of the intermediate-frequency oscillator 118. Now, letting the frequency and the phase of the intermediate-frequency signal 124 be represented by $f_1$ and $\theta_1$, respectively, and the frequency and the phase of the oscillation output from the intermediate-frequency oscillator 118 be represented by $f_1$ and $\theta_2$, respectively, the intermediate-frequency signal 124 is represented by $\sin(f_1 t + \theta_1)$, the output from the intermediate-frequency oscillator 118 by $\sin(f_1 t + \theta_2)$, the output from the filters 222 and 412 by $\sin(nf_1 t + n\theta_1)$ and $\sin\{(n-1)f_1 t + (n-1)\theta_2\}$, respectively, and the output from the filter 223 by $\sin\{f_1 t + n\theta_1 - n\theta_2 + \theta_2\}$. Accordingly, when the amount of compensation by the phase compensator 138 is zero, the output from the phase detector 136 is in proportion to $n(\theta_1 - \theta_2)$, so that the amount of phase rotation caused by the device under test 111 can be displayed with an n-fold resolution. In FIG. 4 it is also possible to apply the output from the phase compensator 138 as an input signal to the multiplier 411 without supplying the output from the oscillator 118 directly to the (n−1) multiplier 411 (as shown by the broken lines). In this case, the output from the oscillator 118 is supplied directly to the phase detector 136. This alternative arrangement is effective because since the phase of the output from the phase compensator 138 is also expanded (n−1) times, the range of phase variation of the phase compensator 138 need not be large, thus facilitating ease in circuit design.

Figure 5:
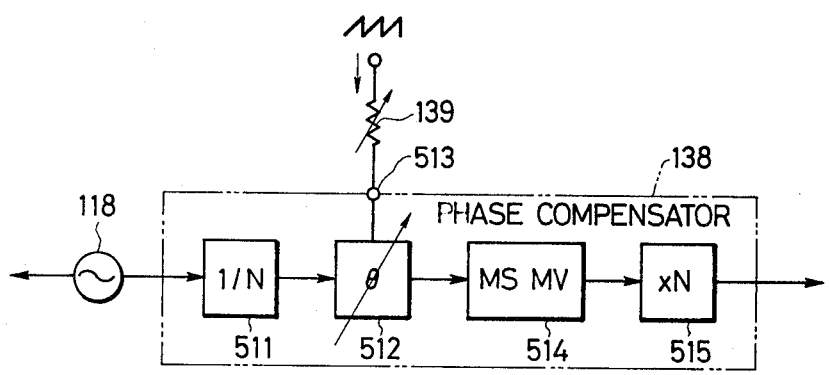
FIG. 5 is a block diagram showing an example of a phase compensator 138 for use in the present invention.

FIG. 5 shows the construction of the phase compensator 138, in which the oscillation output from the intermediate-frequency oscillator 118 is frequency divided by a 1/N times frequency divider 511 down to 1/N times the intermediate frequency. The frequency-divided output is provided to a variable phase shifter 512 which is formed, for example, by a monostable multivibrator. The variable phase shifter 512 is arranged so that the pulse width of its output pulse varies with a control voltage applied to a control terminal 513. By the trailing edge of the output pulse, another monostable multivibrator 514 is triggered to derive therefrom pulses of the fixed pulse width. The output pulses from the monostable multivibrator 514 are frequency multiplied by an N multiplier 515 N times to obtain a signal of the original frequency. By such an N-fold multiplication of the frequency through utilization of the N multiplier 515, the amount of phase shift by the variable phase shifter 512 can be made N-fold. Therefore, even if the amount of phase shift by the variable phase shifter 512 is small, a large amount of phase shift can be obtained. By applying a frequency sweep control signal via the variable resistor 139 to the control terminal 513, the amount of phase shift can be varied with the change in the swept frequency of the signal that is provided to the device under test 111. By changing the resistance value of the variable resistor 139, the amount of phase shift can be adjusted. With the use of such a phase compensator 138, the range of phase variations can be widened with a relatively simple arrangement. In FIG. 5, in the case of employing a monostable multivibrator as the variable phase shifter 512 and controlling its power source voltage to alter the amount of phase shift, it is relatively difficult to make the amount of phase shift-control voltage characteristic linear. In order to make the amount of phase shift undergo linear variations in response to the control voltage, it is possible to adopt a circuit arrangement such, for example, as depicted in FIG. 6. In FIG. 6, there is provided an integrator 603 which is constituted by an operational amplifier 600, an integrating capacitor 601 and an integrating resistor 602. The integrator 603 integrates a fixed voltage of a power source 617 upon each occurrence of a pulse at a terminal 604 and each time the integrated output reaches a voltage at a terminal 605, the integrator 603 is reset. The pulse at the terminal 604 is the signal to be phase shifted, that is, the output from the 1/N frequency divider 511 in FIG. 5, which is provided to a clock terminal CK of a JK flip-flop 606. A K terminal of the flip-flop 606 is grounded and its J terminal is supplied with a constant voltage. To the terminal 604 is applied a pulse shown in FIG. 7A and, by its fall, a Q output from the flip-flop 606 rises up to a high level as illustrated in FIG. 7B. The Q output from the flip-flop 606 is provided to a switch control circuit 607, which turns OFF a switch 608 connected across the integrating capacitor 601 when the Q output from the flip-flop 606 becomes high-level. In consequence, the integrator 603 starts its integrating operation and its output linearly rises as shown in FIG. 7C. The integrated output and a voltage $V_1$ at the terminal 605 are compared by a comparator 609 and, in the case of coincidence, the output from the comparator 609 is inverted to a low level as shown in FIG. 7D. The inverted output is provided to a clear terminal CL of the flip-flop 606 to clear it. Consequently, the Q output from the flip-flop 606 becomes low-level as depicted in FIG. 7B and, by the output from the switch control circuit 607, the switch 608 is turned ON to reset the integrator 603. Upon each fall of the pulse at the terminal 604, the abovesaid operation is repeated. A monostable multivibrator 610 is driven by the fall of the Q output from the flip-flop 606 to obtain at its output terminal 611 a pulse delayed by Td relative to the pulse at the terminal 604 as shown in FIG. 7E. Letting the period of the pulse at the terminal 604 be represented by T, the pulse at the terminal 611 lags the pulse at the terminal 604 by a phase difference of $360° \times (Td/T)$.

By controlling the voltage at the terminal 605, the delay Td is varied linearly with respect to the control voltage. The control signal from the sweep control signal generator 121 in FIG. 3 is supplied via a terminal 612 to a variable voltage chamber 613, wherein it is adjusted to a suitable amplitude, thereafter being provided to an adder 614. A constant voltage is applied from a variable voltage source 615 to the adder 614, wherein a DC voltage is added to the abovesaid control signal. The added voltage is polarity inverted by an inverter 616 and fed to the terminal 605. As a result of this, there is obtained at the terminal 611 a pulse output which varies its amount of delay or phase shift corresponding to the sweep frequency. The output from the variable voltage source 615 is used to compensate for a frequency-independent fixed phase rotation caused by other than the device under test 111, or to provide a bias level to the output of the phase detector 136 when the phase rotation by the device under test 111 is zero, thereby providing a display easy to see.

The phase detector 136 need not always be limited specifically to the aforesaid one but may also be such as utilized in the aforementioned U.S. Pat. No. 3,986,113 and others.

Figures 8, 9, 10:
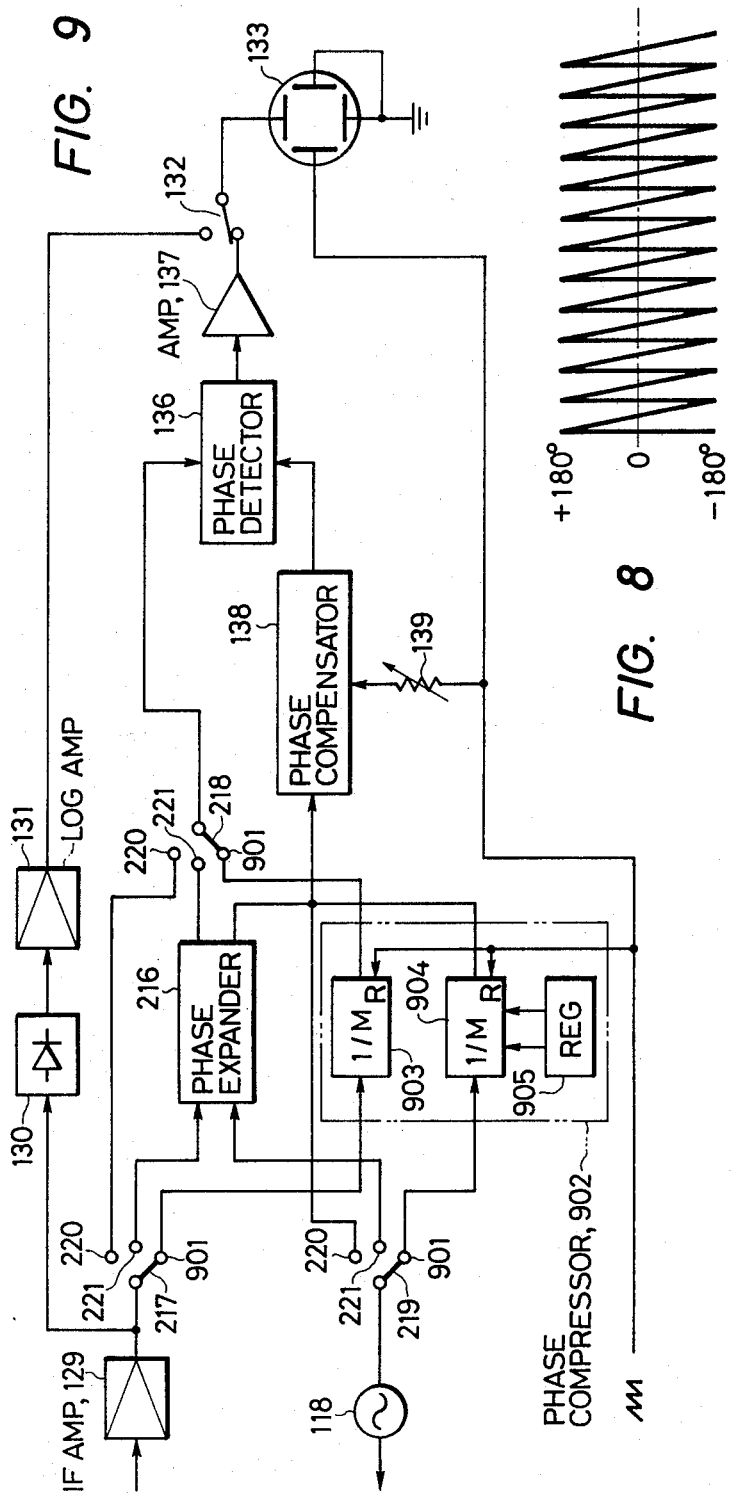
FIG. 8 is a diagram showing an example of a phase characteristic dispalyed on a display surface.
FIG. 9 is a block diagram illustrating another embodiment of the spectrum analyzer of the present invention which is provided with a phase compressor.
FIG. 10 is a diagram showing an example of a phase characteristic displayed on the display surface in the case of employing the phase compressor.

In the case where the amount of phase rotation in the device under test 111 is large, a sawtooth waveform displayed on the surface of the CRT display 133 increments by one sawtooth for each 360° increase in the amount of phase rotation as shown in FIG. 8, so that the amount of phase rotation being displayed is difficult to read out for interpretation. This difficulty can be overcome, however, by the employment of a phase compressor for compressing the phase difference before applying it to the phase detector. For example, as shown in FIG. 9 in which the parts corresponding to those in FIG. 3 are identified by the same reference numerals, the switches 217, 218 and 219 are further provided with fixed contacts 901 and the fixed contacts 901 of the switches 217 and 219 are connected to input terminals of 1/M frequency dividers 903 and 904 of a phase compressor 902, respectively. The frequency dividers 903 and 904 are each reset, for example, by the trailing edge of the sweep control signal. The outputs from the frequency dividers 903 and 904 are supplied to the contact 901 of the switch 218 and the phase compensator 138, respectively. Accordingly, when the switches 217, 218 and 219 are each connected to the fixed contact 901, the intermediate-frequency signal from the intermediate-frequency amplifier 129 is frequency divided by the frequency divider 903 down to 1/M the intermediate frequency and the reference signal from the intermediate-frequency oscillator 118 is frequency divided by the frequency divider 904 down to 1/M. The phase difference between these frequency-divided outputs is 1/M the phase difference between the signals before they are frequency divided. This phase difference is detected by the phase detector 136. Accordingly, in the case of frequency dividing the signals by the frequency dividers 903 and 904 down to 1/10, there is displayed on the display surface of the CRT display 133 the phase difference as a sawtooth waveform having a period of 3600° as shown in FIG. 10 and the display is easier to read out than in the case of FIG. 8.

When employing the phase compensator 138 shown in FIG. 5, the frequency divider 511 is used as the frequency divider 904 too, and in the case of performing phase compression, the multiplier 515 is bypassed.

In the case of phase compression, a preset type frequency divider is employed as the frequency divider 904 for presetting a set value of a register 905 into the frequency divider 904 upon each occurrence of the frequency swept control signal, by which it is possible to provide a fixed phase difference between the outputs from the frequency dividers 903 and 904, compensating for fixed phase rotation by circuit elements other than the device under test 111 or for shifting the display on the CRT display 133 by a constant amount. In FIG. 9, the phase expander 216 need not always be limited specifically to that shown in FIG. 3 but may also be that depicted in FIG. 4.

The amount of compensation by the phase compensator 138 is altered, for example, by adjusting the resistance value of the resistor 139 in accordance with the connection of the switches 217 to 218. If the phase compensator 138 is connected between the oscillator 118 and the switch 219, the amount of compensation need not be changed. The same is true of the embodiments depicted in FIGS. 3 and 4.

While in the foregoing the phase compensator 138 is inserted in the path of the reference signal, that is, in the path from the output of the intermediate-frequency oscillator 118 to the phase detector 136, The phase compensator 138 may also be inserted in the path over which the intermediate-frequency signal 124 is applied to the phase detector 136. Further, the intermediate-frequency signal 124 employed for phase comparison as referred to previously can be derived from an arbitrary position in the intermediate-frequency path from the frequency converter composed of the frequency mixer 122 and the filter 127 to the detector 130. The intermediate-frequency oscillator 118 need not always be one that oscillates at a frequency equal to that of the intermediate-frequency signal to be obtained. It is also possible to adopt such an arrangement in which an intermediate-frequency oscillator of an oscillation frequency equal to the output frequency of the filter 127 is provided at the position of the filter 125, for example, in FIG. 3, and its oscillation output is converted by the frequency mixer 119 and the filter 125 into the frequency of the intermediate-frequency signal 124 that is desired to be obtained and the frequency thus converted is applied to the switch 219. The display 133 need not always be a CRT display but may be one that produces a bright spot on the display surface at a position determined by one input in the lateral direction and the other input in the vertical direction.

As has been described in the foregoing, the spectrum analyzer of the present invention is equipped with the input signal spectrum analyzer function of the prior art spectrum analyzer and, in addition, is capable of measuring the phase-frequency characteristic of the device under test 111 by the additional provision of relatively simple circuits, such as the intermediate-frequency oscillator 118, the frequency mixer 120, the filter 126 and the phase detector 136.

In the conventional network analyzer, it is necessary to vary the oscillation frequencies of the oscillators 11 and 15 over a wide frequency range as described previously in respect of FIG. 1. In the spectrum analyzer of the present invention, however, it is sufficient that the oscillation frequency of the sweep oscillator 116 alone can be varied over a relatively wide frequency range. The sweep oscillator 116 is provided originally in the spectrum analyzer and the oscillation frequency of the newly provided intermediate-frequency oscillator 118 may be fixed. Accordingly, the spectrum analyzer of the present invention can be manufactured at low cost. It might be said that the use of the spectrum analyzer of the present invention is less expensive than the combined use of independent spectrum and network analyzers by the cost of the latter.

Moreover, as described previously with regard to FIGS. 3 and 4, a very small amount of phase rotation in the device under test 111 can be displayed by the phase expander 216 on an enlarged scale with high accuracy. Conversely, in the case where the amount of phase rotation in the device under test 111 is large, its display can be made easy to observe through the use of the phase compressor 902. In the case of employing the phase compensator 138, the frequency-divided output from the frequency divider 511 is phase shifted by the variable phase shifter 512 and its output is frequency multiplied by the multiplier 515, by which even if the phase shift control by the variable phase shifter 512 is made small, a large phase shift can be obtained.

Besides, in each of the foregoing embodiments, the amplitude-frequency characteristic of the device under test 111 can be displayed on the display 133 by supplying the measuring signal from the terminal 113 to the device under test 111 and applying its output to the input terminal 114 while connecting the switch 132 to the contact 134.

It will be apparent that many modifications and variations may be effected without departing from the scope of the novel concepts of the present invention.

What is claimed is:

1. A spectrum analyzer for analyzing the amplitude and phase characteristics of a device under test as a function of frequency, said device being connected between a measuring signal output terminal and an input terminal of the spectrum analyzer, said analyzer comprising:

means for repeatedly generating a sweep control signal, a sweep oscillator controlled by the sweep control signal to repeat a continuous sweeping of its oscillation frequency to repeatedly output a frequency swept signal, a first frequency converter connected to the output of the sweep oscillator, for frequency mixing said frequency swept signal and an input signal from said device under test applied to said input terminal, and to output a corresponding signal;

a first detector connected via a first path to the output of the first frequency converter for detecting a signal corresponding to the amplitude of the output of the first frequency converter;

a first oscillator outputting an oscillating signal at a frequency equal to the frequency of a signal in said first path;

a second frequency converter for frequency mixing a signal corresponding to the output from said first oscillator and said frequency swept signal, and for producing a measuring signal to be supplied to said measuring signal output terminal, said second signal having the same frequency as said output from said first frequency converter; and a second detector for detecting the phase difference between two inputs thereto, these inputs being a signal that is taken-out from said first path and corresponds to said output of said first frequency converter and a reference signal of the same frequency as said taken-out signal, said reference signal being derived from the output of said first oscillator.

2. The analyzer of claim 1, comprising plural frequency conversion stages in said first path, and corresponding stages connected between said second converter and the reference signal input to said phase detector, each pair of these corresponding stages comprising a further respective local oscillator and a respective pair of frequency converters.

3. A spectrum analyzer according to claim 1 which further comprises a phase compressor connected to selectively receive said inputs of the second detector, for making the phase difference therebetween smaller, by frequency dividing, than the phase difference between the taken-out signal and the reference signal.

4. A spectrum analyzer according to claim 3 wherein the phase compressor comprises a first frequency divider for frequency dividing the taken-out signal down to 1/M to provide one output of the phase compressor, and a second frequency divider for frequency dividing the reference signal down to 1/M to provide the other output of the phase compressor, these two outputs of the phase compressor being supplied as said two inputs to the second detector, the first and second frequency dividers being periodically reset by the sweep control signal.

5. A spectrum analyzer according to claim 4 wherein one of the first and second frequency dividers is preset to a fixed phase value upon each resetting and means is provided for selectively setting said fixed value.

6. A spectrum analyzer according to claim 3, 4 or 5 which further comprises means for selectively connecting the phase compressor to the second detector.

7. A spectrum analyzer according to claim 1 which further comprises a phase expander connected to receive at least one of said inputs to said second detector, for making the phase difference between the two input signals to the second detector larger, by frequency multiplying, than the phase difference between said taken-out signal and said reference signal.

8. A spectrum analyzer according to claim 7 which further comprises a phase compressor connected to the inputs of the second detector, for making the phase difference between the two input signals to the second detector smaller, by frequency dividing, than the phase difference between the taken-out signal and the reference signal, and means for selectively connecting the phase compressor or the phase expander to the second detector.

9. A spectrum analyzer according to claim 7 wherein the phase expander comprises a first multiplier for frequency multiplying the taken-out signal n times, a second multiplier for frequency multiplying the reference signal n times, a first local oscillator, and third and fourth frequency converters for frequency mixing the oscillation output from the first local oscillator and the outputs from the first and second multipliers, respectively, and for providing the signals as outputs from the phase expander as said inputs to said phase detector for said phase difference detecting.

10. The analyzer of claim 9, wherein wherein the two outputs of the phase expander have the same frequency as the inputs, thereto.

11. A spectrum analyzer according to claim 7 wherein the phase expander comprises a first multiplier for frequency multiplying one of the taken-out and the reference signals (n−1) times, a second multiplier for frequency multiplying the other of said taken-out and reference signals n times, and a third frequency converter for frequency mixing the outputs from the first and second multipliers to obtain an expanded output signal having frequency equal to that of the taken-out and reference signals, and to supply this expanded output signal in place of one of said inputs to the phase detector for said phase difference detecting.

12. A spectrum analyzer according to claim 7, 9 or 11 which further comprises means for selectively connecting the phase expander to the second detector.

13. The analyzer of claim 1, 7, 9, 11, 3, 4, 5 or 8, comprising said taken-out signal and said signal that is detected by said first detector signal both having the same frequency as the output of said first frequency converter, and said reference signal having the same frequency as the output of said first oscillator.

14. The analyzer of claim 1, 7, 9, 11, 3, 4, 6, or 8 comprising:
a changeover switch for selecting the output from each of said first and second detectors; and
a display supplied with the output from the changeover switch and the sweep control signal to display said amplitude and phase characteristics of said device under test as a function of frequency.

15. The analyzer of claim 1, 7, 9, 11, 3, 4, 5, 6 or 8, wherein said first oscillator is an intermediate-frequency oscillator, said first path is a path for an intermediate-frequency signal, and the output of said first frequency converter is an intermediate-frequency signal.

16. The analyzer of claim 1, 7, 9, 11, 3, 4, 5, or 8, comprising:
a second local oscillator;
a fifth frequency converter in said first path, for mixing the output of the first frequency converter and the output of the second local oscillator, and for supplying as an output both said signal detected by said first detector and said taken-out signal with the same frequencies; and
a sixth frequency converter for mixing the output of the second local oscillator with a signal corresponding to the output of said first oscillator, and for supplying the output as the input to said second frequency converter.

17. The analyzer of claim 16, wherein the frequency of the output of said first oscillator is the same as the frequency of both said output from said first reference converter and said reference signal.

18. The analyzer of claim 16, wherein said first oscillator is located so as to supply its output as said second selected signal to said second frequency converter and also to supply its output as an input to said sixth frequency converter, the output of the sixth frequency converter is said first selected signal, and said first selected signal and said reference signal have the same frequency.

19. The analyzer of claim 16, comprising:
a changeover switch for selecting the output from each of said first and second detectors; and
a display supplied with the output from the changeover switch and the sweep control signal to display said amplitude and phase characteristics of said device under test as a function of frequency.

20. The spectrum analyzer according to claim 1, 7, 9, 11, 3, 4, 5, or 8, comprising:
two signal paths for providing said two inputs to the phase detector, a first one of said two signal paths extending from said input terminal of the analyzer to the respective input to the phase detector, and the other one of said two signal paths extending from the output of said first oscillator to the respective input to the second detector;
a phase compensation circuit inserted in series into one of said two signal paths; and
means for controlling the phase compensation circuit to shift the phase of the input to the second detector via the one of said two signal paths under the control of the sweep control signal.

21. A spectrum analyzer according to claim 20 wherein the phase compensation circuit comprises a frequency divider for dividing the frequency of the input signal thereto down to 1/N, a variable phase shifter supplied with the output from the frequency divider to shift its phase under the control of the sweep control signal, and a multiplier supplied with the output from the variable phase shifter to multiply its frequency N times.

22. A spectrum analyzer according to claim 21 wherein the variable phase shifter comprises an integrator for linearly integrating a constant voltage, means for starting the integration of the integrator upon each occurrence of an input pulse corresponding to the sweep control signal, a comparator for comparing the integrated output and the sweep control signal as two inputs thereto, means for resetting the integrator by the detected output from the comparator upon detection of coincidence between said two inputs to the comparator, and means for generating an output pulse delayed in phase behind the input pulse corresponding to the sweep control signal with respect to the moment of resetting of the integrator.

* * * * *

UNITED STATES PATENT AND TRADEMARK OFFICE
CERTIFICATE OF CORRECTION

PATENT NO. : 4,451,782

DATED : 29 May 1984

INVENTOR(S) : Ashida

It is certified that error appears in the above-identified patent and that said Letters Patent is hereby corrected as shown below:

Col. 1, line 57, after the first occurrence of "sweep" insert --control--;

line 58, delete "control".

Col. 3, line 41, "cells" should be --calls--.

Col. 6, line 33, "(n-10)" should be --(n-1)--.

Col. 7, line 1, delete "times".

Col. 9, line 23, "218" should be --219--;

line 31, "The" should be --the--.

Claim 5, line 4, after "fixed" insert --phase--.

Claim 10, line 1, delete the second occurrence of "wherein".

Claim 13, put claim dependencies in proper numerical order.

Claim 14, line 1, after "4," insert --5--; and put claim dependencies in numerical order.

Claim 16, line 1, put claim dependencies in proper numerical order.

UNITED STATES PATENT AND TRADEMARK OFFICE
CERTIFICATE OF CORRECTION

PATENT NO. : 4,451,782

DATED : 29 May 1984

INVENTOR(S) : Ashida

It is certified that error appears in the above-identified patent and that said Letters Patent is hereby corrected as shown below:

Claim 20, lines 1 and 2, put claim dependencies in proper numerical order.

Signed and Sealed this

Eighth Day of January 1985

[SEAL]

Attest:

Attesting Officer

GERALD J. MOSSINGHOFF

Commissioner of Patents and Trademarks